United States Patent [19]

Meslener et al.

[11] Patent Number: 4,647,792
[45] Date of Patent: Mar. 3, 1987

[54] HIGH SPEED LASER DRIVER

[75] Inventors: George J. Meslener, Acton; Peter N. Baum, Bedford, both of Mass.

[73] Assignee: GTE Laboratories Incorporated, Waltham, Mass.

[21] Appl. No.: 755,041

[22] Filed: Jul. 15, 1985

[51] Int. Cl.[4] .......................... H03K 3/01; H03K 3/42; H01S 3/00

[52] U.S. Cl. .................................. 307/270; 307/254; 307/311; 307/317 A; 372/38

[58] Field of Search ............... 307/254, 270, 311, 454, 307/317 A; 330/254; 372/38, 25

[56] References Cited

U.S. PATENT DOCUMENTS 3,660,679  5/1972  Ishigaki et al. ..................... 307/270
3,803,505  4/1974  Ishigaki et al. ..................... 330/254
4,219,744  8/1980  Shinn, II ........................... 307/317 A Primary Examiner—John S. Heyman
Assistant Examiner—B. P. Davis
Attorney, Agent, or Firm—Fred Fisher

[57] ABSTRACT

A high speed laser driver includes a differential pair of bipolar transistors sharing a common emitter resistor as in the prior art. However, an improvement thereover resides in the use of Schottky barrier diodes, one of which couples the emitter of one transistor to the common emitter resistor and the other of which couples the emitter of the other transistor to the common emitter resistor. Furthermore, separate resistors couple the emitters of both transistors to a voltage source so that the transistors are always conducting.

5 Claims, 2 Drawing Figures

HIGH SPEED LASER DRIVER

BACKGROUND OF THE INVENTION

1. Field of the Invention

This invention relates to laser drivers and, in particular, to high speed laser drivers. Accordingly, it is a general object of this invention to provide new and improved laser drivers of such character.

2. General Background

A commonly used circuit for modulating diode lasers includes a differential pair of bipolar transistors which share a common emitter resistor (or, alternatively, a constant current source, such as another transistor). A separate laser biasing network was required.

The advantages of using such a laser driver of the prior art include independent control over laser modulating and biasing controls, isolation between laser and input signal, and accurate control of the modulating current shape, particularly at the low current level.

A significant disadvantage of the prior art type of driver is its speed limitations, which is caused by operating the bipolar transistors from cut-off to normal conduction.

SUMMARY OF THE INVENTION

Another object of this invention is to provide a new and improved high speed laser driver in which significantly higher switching speeds than the prior art can be achieved with transistors remaining conducting within their optimum performance range while switching currents of sufficient amplitude to properly modulate the diode laser.

In accordance with one aspect of this invention, an improvement is provided in a laser driver having a first transistor with one electrode adapted to be coupled to a point of reference potential, and a control electrode adapted to receive input signals ranging from one voltage level to a second voltage level. A serial circuit includes a laser diode having one electrode adapted to be coupled to a point of reference potential, and a second transistor having one electrode coupled to a second electrode of the laser diode. The second transistor has a control electrode adapted to be coupled to a bias level between the one voltage level and the second voltage level. A first resistor has one terminal adapted to be coupled to a third voltage level. First means couple the second electrode of the first transistor to a second terminal of the first resistor. Second means couple the second electrode of the second transistor to the second terminal of the first resistor. The improvement in the laser driver is provided by including a first high speed diode in the aforesaid first means and including a second high speed diode in the aforesaid second means. The improvement further comprises a second resistor for coupling the second terminal of the first transistor to a fourth voltage level, and a third resistor for coupling the second terminal of the second transistor to the fourth voltage level.

In accordance with certain aspects of the invention, the transistors can be of the same conductivity type and each high speed diode is a Schottky barrier diode. Each of the transistors set forth hereinabove can be switched from a non-conductive condition to a conductive condition within a switching time $t_1$, but with each of the transistors in a conductive condition, the high speed diodes can be switched from conductive/non-conductive conditions to non-conductive/conductive conditions, respectively, within a switching time $t_2$, wherein $t_2$ is less than $t_1$. Further, both of the transistors can be bipolar n-p-n semiconductor transistors, where each transistor can have its own independent collector, emitter and base electrodes. A first high speed diode has an anode coupled to the emitter of the first transistor and a second high speed diode has an anode coupled to the emitter of the second transistor. Each of the high speed diodes has a cathode coupled to the other. All the recited elements can be monolithically formed on a semiconductor integrated circuit chip.

In accordance with another aspect of the invention, a laser driver includes a first n-p-n bipolar transistor having a collector adapted to be coupled to a point of reference potential and a base adapted to receive input signals ranging from one voltage level to a second voltage level. A second n-p-n bipolar transistor has a collector coupled to a cathode of a laser diode. The second n-p-n bipolar transistor has a base adapted to be coupled to a bias level between the one voltage level and the second voltage level. The laser diode has an anode adapted to be coupled to a point of reference potential. A common resistor has one terminal adapted to be coupled to a third voltage level. A first Schottky barrier diode has an anode coupled to the emitter of the first transistor. A second Schottky barrier diode has an anode coupled to the emitter of the second transistor. The cathodes of both Schottky barrier diodes are coupled together to the second terminal of the common resistor. A second resistor couples the emitter of the first transistor to a fourth voltage level and a third resistor couples the emitter of the second transistor to the fourth voltage level.

In accordance with certain aspects of the invention, the one voltage level, the second voltage level, the third voltage level, and the fourth voltage level are all negative potential levels $E_1$, $E_2$, $E_3$, and $E_4$, respectively, wherein $E_3 < E_2 < E_1$ and $E_4 < E_2 < E_1$. All of the recited elements can be monolithically formed on an integrated semiconductor circuit chip.

BRIEF DESCRIPTION OF THE DRAWINGS

Other object, advantages, and features of this invention, together with its construction and mode of operation, will become more apparent from the following description, when read in conjunction with the accompanying drawings, in which.

GENERAL DESCRIPTION

Figure 1:
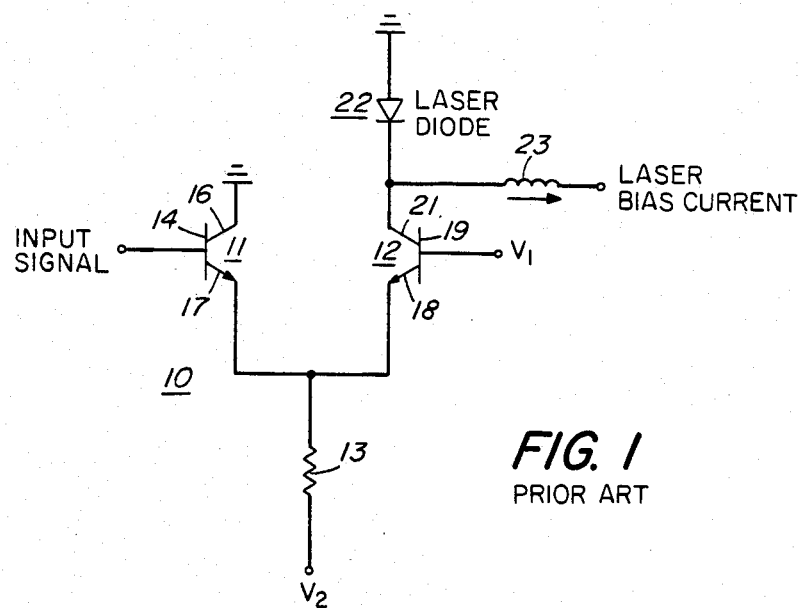
FIG. 1 is a circuit diagram of a prior art laser driver.

FIG. 1 depicts a typical laser driver 10 including a differential pair of bipolar transistors 11, 12 sharing a common emitter resistor 13. The input signal, typically ranging from $-1.8$ volts to $-2.6$ volts, would be applied to the base 14 of the bipolar n-p-n transistor 11. The collector 16 would be coupled to a point of reference potential, such as ground. The emitter 17 of the transistor 11 and the emitter 18 of the transistor 12 are coupled together through the resistor 13 to a voltage source $V_2$ which typically may be $-5$ volts. By way of example, the resistor 13 has a value of 33 ohms. The base 19 of the n-p-n transistor 12 is coupled to a voltage source $V_1$, which typically is $-2.2$ volts. The collector 21 of the transistor 12 is coupled to a cathode of the laser diode 22 whose anode is coupled to a point of reference potential such as ground. Laser bias current is provided to the laser diode 22 through a circuit which includes an inductor 23. Current applied to the inductor 23 may range from 25 to 50 mA, by way of example.

In operation, with a conventional driver 10, dc current is applied to the laser diode 22 through the inductor 23, biasing the laser diode 22 usually just above lasing threshold. When the input signal that is applied to the base 14 of the transistor 11 is more positive than the voltage $V_1$ that is applied to the base 19 of the transistor 12, the base 19/emitter 18 junction of the transistor 12 is reversed biased, cutting off the transistor 12. All of the current flowing through the resistor 13 passes through the transistor 11. When the input signal that is applied to the base 14 of the transistor 11 changes to become more negative than $V_1$, the transistor 11 turns off and the transistor 12 turns on, causing all of the current that flows through the resistor 13 to be applied to the laser diode 22. However, there is typically a 250 to 500 ps delay between the time the input signal goes negative and the time the transistor 12 turns completely on, limiting the rate at which the laser diode 22 can be modulated to approximately 1 Gb/s.

THE NEW LASER DRIVER

Figure 2:
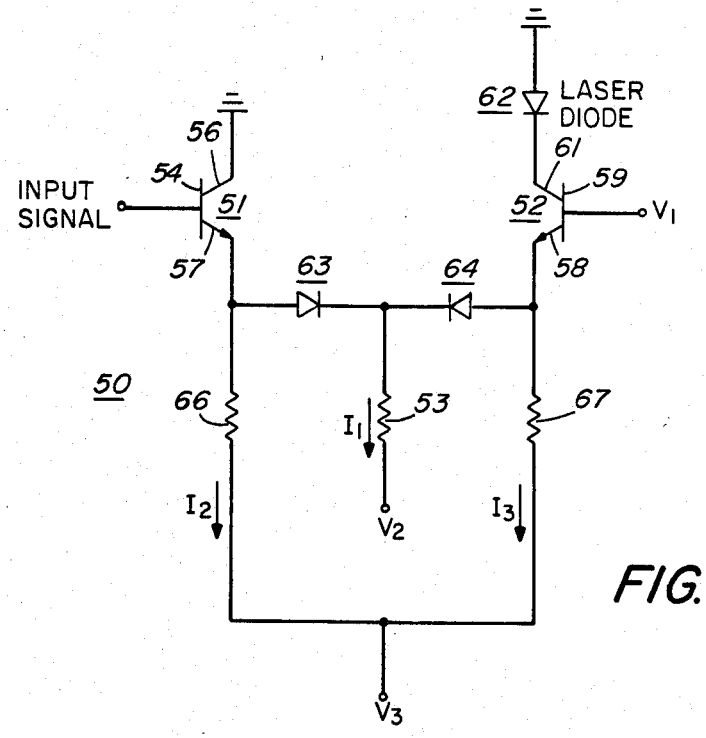
FIG. 2 is a circuit diagram of a high speed laser driver in accordance with one embodiment of the invention.

The new laser driver 50, in accordance with the preferred embodiment of this invention, as depicted in FIG. 2, is similar to the prior art circuit indicated in FIG. 1 with noted exceptions.

As depicted in FIG. 2, applicants' new driver circuit 50 includes a differential pair of bipolar transistors 51, 52. The input signal can be applied to the base 54 of the transistor 51 whose collector 56 is coupled to a point of reference potential, such as ground. The transistor 51 has an emitter 57.

The transistor 52 has an emitter 58, a base 59 which is adapted to be coupled to the control voltage $V_1$ and a collector 61 which is adapted to be coupled to a cathode of the laser diode 62. The anode of the laser diode 62 is coupled to a point of reference potential, such as ground.

It is noted that the circuit as depicted in FIG. 2 does not include an inductor for biasing the laser diode 62. The emitter 57 of the transistor 51 is coupled to an anode of a Schottky barrier diode 63. The emitter 58 of the transistor 52 is coupled to the anode of a Schottky barrier diode 64. The cathodes of the Schottky barrier diodes 63, 64 are coupled together to a resistor 53 which, in turn, is coupled to a voltage level $V_2$.

The voltage level $V_2$ may range from $-3$ to $-5$ volts. By way of example, the resistors 53 can be 33 ohms. The voltage $V_1$ can be $-2.2$ volts and the input signal as applied to the base 54 may be $-1.8$ to $-2.6$ volts.

Further, the emitter 57 of the transistor 51, in addition to being coupled to the anode of the diode 63, is coupled through a resistor 66 to a voltage source $V_3$. Similarly, the emitter 58 of the transistor 52 is coupled through a resistor 67 to the voltage source $V_3$. The voltage source $V_3$ may range from $-3$ to $-5$ volts. Typically, the resistance values of the resistors 66, 67 may be 51 ohms each. For sake of illustration, the current traveling through the resistor 53 is designated $I_1$, the current traveling through the resistor 66 is $I_2$, and the current traveling through the resistor 67 is $I_3$.

The new laser driver 50, as shown in FIG. 2, is similar to the conventional circuit shown in FIG. 1, except that when the input signal applied to the base 54 of the transistor 51 is more positive than the voltage level at the base 59 of the transistor 52, the diode 63 conducts and the diode 64 is turned off. All of the current flowing through the resistance 53 flows through the diode 63 and the transistor 51, and none through the diode 64. That is, the current flowing through the transistor 51 is equal to $I_1$ plus $I_2$. The transistor 52, however, still conducts the current $I_3$ which also flows through the laser diode 62. This current is set to a value which biases the laser 62 just above lasing threshold. When the input signal goes negative, the diode 63 turns off and the diode 64 turns on, switching the current $I_1$ to the laser diode 62 via the diode 64 and the transistor 52. The bipolar transistor 51 does not turn off but remains conducting at the value of the current $I_2$. By using Schottky barrier diodes for the diodes 63, 64, switching actually takes place very quickly. As the transistors 51, 52 are always operating within their optimum operating region, fast switching time and high speed operation are virtually guaranteed. This new circuit still incorporates all of the good features of the conventional laser driver including independent control over laser modulating and biasing currents, laser isolation, and accurate control of the modulating current shape without the speed limitations of the conventional design.

In general, with this new high speed laser driver, the two transistors conduct at all times, the two diodes are switched on and off, respectively. Normally, the current $I_3$ is sufficient to keep the laser diode 62 biased above threshold. When the current $I_1$ is added to the current $I_3$, which represents the modulation, the high current level goes through the laser 62. When all the current $I_1$ flows through the transistor 51, that represents the low current level through the laser 62, which is still above threshold. When the input signal at the base 54 of the transistor 51 is more positive than the voltage level at the base 59 of the transistor 52, the emitter 57 of the transistor 51 is more positive than the emitter 58 of the transistor 52. Therefore, the diode 63 turns on and the diode 64 turns off. The currents $I_1$ and $I_2$ both flow through the transistor 51. The only current that flows through the transistor 52 is $I_3$, which is the current required to keep the laser slightly above threshold, which is the low output level from the laser. When the input signal at the base 54 goes negative with respect to the voltage applied to the base 59 of the transistor 52, the emitter of the transistor 51 goes more negative than the emitter 58 of the transistor 52. The diode 63 turns off, the diode 64 turns on, and the current that flows through the transistor 52 becomes $I_1$ plus $I_3$, which is the high current level through the laser. Thus, modulation is obtained by causing the current $I_1$ to travel alternately through the diode 63 or 64 depending upon whether or not a 1 or a 0 is transmitted.

To achieve the foregoing desired results, Schottky barrier diodes are preferred due to their high speed, high turn on and high turn off times.

With the new and improved circuitries indicated in this disclosure, the rate of which the laser can be modulated is an excess of 3 Gb/s, as compared to about 1 Gb/s of the prior art circuitry indicated hereinabove.

Although n-p-n microwave transistors are preferred due to their high speed which operate at about 25 or 30 mA, this invention is not limited thereto. Conceptually, p-n-p type transistors can be used with minor modifications, such as by reversing the laser diode; n-p-n type transistors are preferred due to their high speeds.

In the prior art circuit hereinabove, a pair of transistors were used in which one transistor conducts and the other transistor is non-conductive. There was a significant time delay in switching the transistors on and off, whereas with the novel invention described herein, the new and improved circuit utilizes a pair of transistors which are always conducting, although they may be conducting at a low rate and a high rate. With this instant invention, there is a pair of opposed diodes in the emitter circuit which are coupled through a common resistor to a modulation control voltage where the diodes are switched on and off, one diode being switched on while the other one is being switched off, alternately back and forth. It is the conception of this invention that diodes can be turned on and off much faster than transistors can be turned on and off, especially through the use of Schottky barrier diodes.

Advantages of this new and improved circuit include fast switching of the modulating current not normally obtainable with other current mode switching circuits of the prior art. Another advantage is that very good independent control of both the bias and the modulating current is obtainable, making the circuitry quite flexible for use.

Various modifications can be performed with this invention without departing from the spirit and scope thereof. For example, the circuit can be incorporated in a monolithically formed integrated circuit.

What is claimed is:

1. In a laser driver including
   a first transistor having one electrode adapted to be coupled to a point of reference potential, a second electrode, and a control electrode adapted to receive input signals ranging from one voltage level to a second voltage level;
   a serial circuit including a laser diode having one electrode adapted to be coupled to a point of reference potential, and having a second electrode, and a second transistor having one electrode coupled to said second electrode of said laser diode, a second electrode, and a control electrode adapted to be coupled to a bias level between said one voltage level and said second voltage level;
   a first resistor having one terminal adapted to be coupled to a third voltage level, and a second terminal;
   first means coupling said second electrode of said first transistor to said second terminal; and
   second means coupling said second electrode of said second transistor to said second terminal, the improvement wherein
   said first means includes a first high speed diode,
   said second means includes a second high speed diode,
   said transistors are of the same conductivity type, and wherein each said high speed diode is a Schottky barrier diode,
   and wherein the improvement further comprises
   a second resistor for coupling said second terminal of said first transistor to a fourth voltage level; and
   a third resistor for coupling said second terminal of said second transistor to said fourth voltage level.

2. In a laser driver including
   a first transistor having one electrode adapted to be coupled to a point of reference potential, a second electrode, and a control electrode adapted to receive input signals ranging from one voltage level to a second voltage level;
   a serial circuit including a laser diode having one electrode adapted to be coupled to a point of reference potential, and having a second electrode, and a second transistor having one electrode coupled to said second electrode of said laser diode, a second electrode, and a control electrode adapted to be coupled to a bias level between said one voltage level and said second voltage level;
   a first resistor having one terminal adapted to be coupled to a third voltage level, and a second terminal;
   first means coupling said second electrode of said first transistor to said second terminal; and
   second means coupling said second electrode of said second transistor to said second terminal, the improvement wherein
   said first means include a first high speed diode,
   said second means includes a second high speed diode,
   and wherein the improvement further comprises
   a second resistor for coupling said second terminal of said first transistor to a fourth voltage level; and
   a third resistor for coupling said second terminal of said second transistor to said fourth voltage level,
   and wherein each of said transistors set forth in the preamble can be switched from a non-conductive condition to a conductive condition within a switching time $t_1$, but with each of said transistors in a conductive condition, said high speed diodes can be switched from conductive/non-conductive conditions to non-conductive/conductive conditions, respectively, within a switching time $t_2$, wherein $t_2 < t_1$.

3. The improvement as recited in claim 2 wherein said transistors are of the same conductivity type and wherein each of said high speed diodes is a Schottky barrier diode.

4. The improvement as recited in claim 3 wherein both said transistors are bipolar n-p-n semiconductor transistors;
   said one electrode, said second electrode, and said control electrode of said first transistor are collector, emitter, and base electrodes, respectively;
   said one electrode and said second electrode of said laser diode are anode and cathode, respectively;
   said one electrode, said second electrode, and said control electrode of said second transistor are collector, emitter, and base electrodes, respectively; and
   said first high speed diode has an anode coupled to said first transistor emitter, said second high speed diode has an anode coupled to said second transistor emitter, and both said first high speed diode and said second high speed diodes each having a cathode coupled to each other.

5. A laser driver comprising
   a first n-p-n bipolar transistor having a collector adapted to be coupled to a point of reference potential, a base adapted to receive input signals ranging from one voltage level to a second voltage level, and an emitter;
   a laser diode having an anode adapted to be coupled to a point of reference potential, and a cathode;
   a second n-p-n bipolar transistor having a collector coupled to said cathode of said laser diode, a base adapted to be coupled to a bias level between said one voltage level and said second voltage level;

a common resistor having one terminal adapted to be coupled to a third voltage level, and a second terminal;

a first Schottky barrier diode having an anode coupled to said emitter of said first transistor, and a cathode;

a second Schottky barrier diode having an anode coupled to said emitter of said second transistor, and having a cathode, said cathodes of both said Schottky barrier diodes being coupled together to said second terminal of said common resistor;

a second resistor for coupling said emitter of said first transistor to a fourth voltage level; and a third resistor for coupling said emitter of said second transistor to said fourth voltage level, wherein said one voltage level, said second voltage level, said third voltage level, and said fourth voltage level are all negative potential levels $E_1$, $E_2$, $E_3$, and $E_4$, respectively, and wherein $E_3 < E_2 < E_1$ and $E_4 < E_2 < E_1$.

* * * * *